(12) United States Patent
Allman et al.

(10) Patent No.: US 6,528,389 B1
(45) Date of Patent: Mar. 4, 2003

(54) SUBSTRATE PLANARIZATION WITH A CHEMICAL MECHANICAL POLISHING STOP LAYER

(75) Inventors: Derryl D. J. Allman, Colorado Springs, CO (US); John W. Gregory, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/213,948

(22) Filed: Dec. 17, 1998

(51) Int. Cl.$^7$ .............................................. H01L 21/46
(52) U.S. Cl. ....................... 438/424; 438/697
(58) Field of Search ................. 438/424, 431, 438/697

(56) References Cited

U.S. PATENT DOCUMENTS

| | | |
|---|---|---|
| 4,385,975 A | 5/1983 | Chu et al. ................. 204/192 E |
| 4,671,970 A * | 6/1987 | Keiser et al. .................. 427/93 |
| 4,793,895 A | 12/1988 | Kaanta et al. |
| 5,036,015 A | 7/1991 | Sandhu et al. |
| 5,077,234 A | 12/1991 | Scoopo et al. ................. 437/67 |
| 5,081,421 A | 1/1992 | Miller et al. |
| 5,151,584 A | 9/1992 | Ebbing et al. |
| 5,169,491 A | 12/1992 | Doan |
| 5,174,858 A * | 12/1992 | Yamamoto et al. ......... 156/643 |
| 5,196,353 A | 3/1993 | Sandhu et al. |
| 5,222,329 A | 6/1993 | Yu |
| 5,240,552 A | 8/1993 | Yu et al. |
| 5,245,790 A | 9/1993 | Jerbic |
| 5,245,794 A | 9/1993 | Salugsugan |
| 5,265,378 A | 11/1993 | Rostoker |
| 5,272,115 A | 12/1993 | Sato |
| 5,308,438 A | 5/1994 | Cote et al. |
| 5,310,455 A | 5/1994 | Pasch et al. |
| 5,321,304 A | 6/1994 | Rostoker |
| 5,337,015 A | 8/1994 | Lustig et al. |
| 5,350,486 A * | 9/1994 | Huang ........................ 438/624 |
| 5,356,513 A | 10/1994 | Burke et al. ................. 156/636 |
| 5,362,669 A * | 11/1994 | Boyd et al. ................. 438/437 |
| 5,389,194 A | 2/1995 | Rostoker et al. |
| 5,399,234 A | 3/1995 | Yu et al. |

(List continued on next page.)

OTHER PUBLICATIONS

IBM Technical Disclosure Bulletin; Method to Control Dishing in Chemical–Mechanical Polishing; Sep. 1990; No. 4, pp. 223–224.

Primary Examiner—Eddie Lee
Assistant Examiner—Paul E Brock, II
(74) Attorney, Agent, or Firm—Hitt Gaines & Boisbrun, P.C.

(57) ABSTRACT

This invention comprises an improved method of planarizing, an integrated circuit formed onto a semiconductor substrate and the planarized semiconductor substrate. Improved planarity is accomplished through the use a first and second stop layer separated by a filler layer. A first stop layer is used to define active and trench regions. A filler layer is then applied over the surface of the substrate and a second stop layer is applied on top of the filler layer. The second stop layer is patterned through etching. The pattern etched into the second stop layer is used to control chemical mechanical polishing that planarizes the surface. Patterns can be a reverse image of an active mask or a continuous pattern. In addition CMP can be used to create a condition of equilibrium planarity before the second stop layer is applied. The stop layers can comprise polysilicon, silicon nitride, or another material that is harder than a dielectric oxide material used as filler material. In addition a polysilicon stop layer may be exposed to a thermal cycle and oxidized into silicon dioxide after some degree of planarization to further regulate chemical mechanical polishing.

14 Claims, 3 Drawing Sheets

U.S. PATENT DOCUMENTS

| | | |
|---|---|---|
| 5,403,228 A | 4/1995 | Pasch |
| 5,405,806 A | 4/1995 | Pfeister et al. |
| 5,439,551 A | 8/1995 | Meikle et al. |
| 5,483,568 A | 1/1996 | Yano et al. |
| 5,492,594 A | 2/1996 | Burke et al. |
| 5,494,857 A | 2/1996 | Cooperman et al. ........ 437/228 |
| 5,516,400 A | 5/1996 | Pasch et al. |
| 5,531,861 A | 7/1996 | Yu et al. |
| 5,559,428 A | 9/1996 | Li et al. |
| 5,561,541 A | 10/1996 | Sharp et al. |
| 5,595,526 A | 1/1997 | Yau et al. |
| 5,597,442 A | 1/1997 | Chen et al. |
| 5,609,511 A | 3/1997 | Moriyama et al. |
| 5,616,513 A | 4/1997 | Shepard ...................... 438/402 |
| 5,618,381 A | 4/1997 | Doan et al. ................. 438/633 |
| 5,624,304 A | 4/1997 | Pasch et al. |
| 5,626,715 A | 5/1997 | Rostoker |
| 5,637,185 A | 6/1997 | Murarka et al. |
| 5,639,388 A | 6/1997 | Kimura et al. |
| 5,643,046 A | 7/1997 | Katakabe et al. |
| 5,643,050 A | 7/1997 | Chen |
| 5,644,221 A | 7/1997 | Li et al. |
| 5,647,952 A | 7/1997 | Chen |
| 5,658,183 A | 8/1997 | Sandhu et al. |
| 5,660,672 A | 8/1997 | Li et al. |
| 5,663,797 A | 9/1997 | Sandhu |
| 5,664,987 A | 9/1997 | Renteln |
| 5,667,424 A | 9/1997 | Pan |
| 5,667,433 A | 9/1997 | Mallon |
| 5,667,629 A | 9/1997 | Pan et al. |
| 5,668,063 A | 9/1997 | Fry et al. |
| 5,670,410 A | 9/1997 | Pan |
| 5,672,091 A | 9/1997 | Takahashi et al. |
| 5,674,784 A | 10/1997 | Jang et al. |
| 5,695,660 A | 12/1997 | Litvak |
| 5,700,180 A | 12/1997 | Sandhu et al. |
| 5,705,435 A | 1/1998 | Chen |
| 5,710,076 A | 1/1998 | Dai et al. |
| 5,712,185 A | | 1/1998 | Tsai et al. |
| 5,721,172 A | | 2/1998 | Jang et al. ................... 438/424 |
| 5,722,875 A | | 3/1998 | Iwashita et al. |
| 5,728,620 A | | 3/1998 | Park ........................... 438/425 |
| 5,741,171 A | | 4/1998 | Sarfaty et al. |
| 5,777,739 A | | 7/1998 | Sandhu et al. |
| 5,792,707 A | | 8/1998 | Chung ........................ 438/633 |
| 5,804,490 A | * | 9/1998 | Fiegl et al. .................. 438/424 |
| 5,861,055 A | | 1/1999 | Allman et al. |
| 5,865,666 A | | 2/1999 | Nagahara |
| 5,868,608 A | | 2/1999 | Allman et al. |
| 5,882,251 A | | 3/1999 | Berman et al. |
| 5,888,120 A | | 3/1999 | Doran |
| 5,893,756 A | | 4/1999 | Berman et al. |
| 5,911,110 A | * | 6/1999 | Yu ............................... 438/424 |
| 5,930,644 A | * | 7/1999 | Tsai et al. .................... 438/424 |
| 5,931,719 A | | 8/1999 | Nagahara et al. |
| 5,943,590 A | * | 8/1999 | Wang et al. ................. 438/427 |
| 5,948,697 A | | 9/1999 | Hata |
| 5,957,757 A | | 9/1999 | Berman |
| 5,958,795 A | * | 9/1999 | Chen et al. .................. 438/692 |
| 6,004,863 A | * | 12/1999 | Jang ........................... 438/427 |
| 6,015,757 A | * | 1/2000 | Tsai et al. .................... 438/697 |
| 6,033,961 A | * | 3/2000 | Xu et al. ...................... 438/295 |
| 6,043,133 A | * | 3/2000 | Jang et al. ................... 438/401 |
| 6,048,771 A | * | 4/2000 | Lin et al. ..................... 438/296 |
| 6,057,207 A | * | 5/2000 | Lin et al. ..................... 438/424 |
| 6,057,210 A | * | 5/2000 | Yang et al. .................. 438/427 |
| 6,063,689 A | * | 5/2000 | Chen et al. .................. 438/424 |
| 6,080,635 A | * | 6/2000 | Jang et al. ................... 438/401 |
| 6,093,956 A | * | 7/2000 | Moore et al. ................ 257/635 |
| 6,124,183 A | | 9/2000 | Karlsson et al. ............. 438/427 |
| 6,146,975 A | * | 11/2000 | Kuehne et al. .............. 438/437 |
| 6,147,013 A | * | 11/2000 | Sun et al. ..................... 438/791 |
| 6,150,072 A | * | 11/2000 | Shoda et al. ................. 430/313 |
| 6,169,012 B1 | * | 1/2001 | Chen et al. .................. 438/427 |
| 6,255,176 B1 | | 7/2001 | Kim et al. |

\* cited by examiner

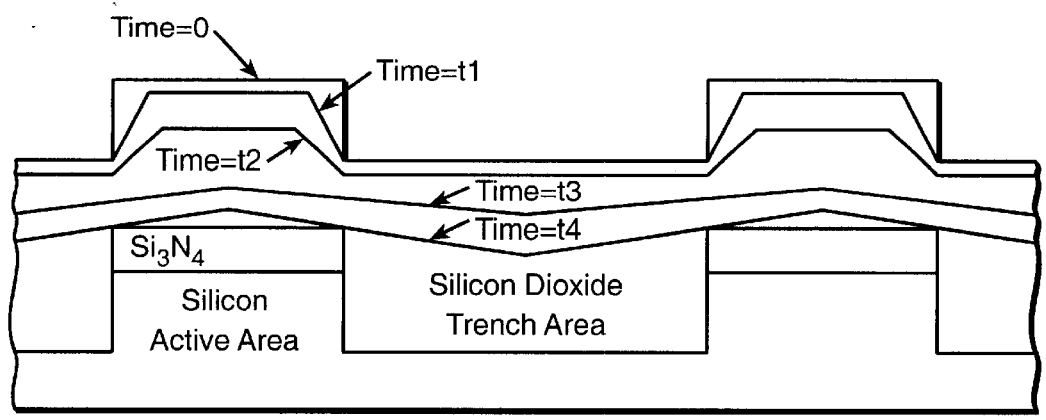
FIG._1 (PRIOR ART)
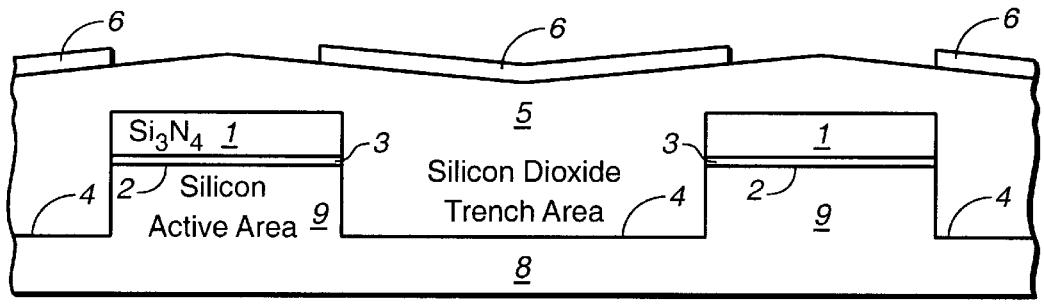
FIG._2
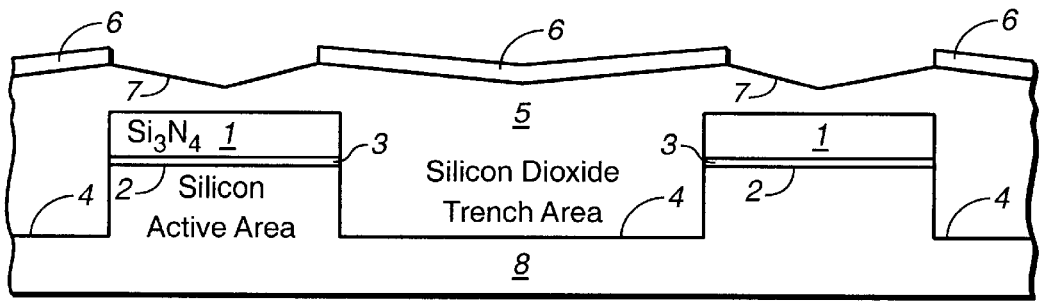
FIG._3
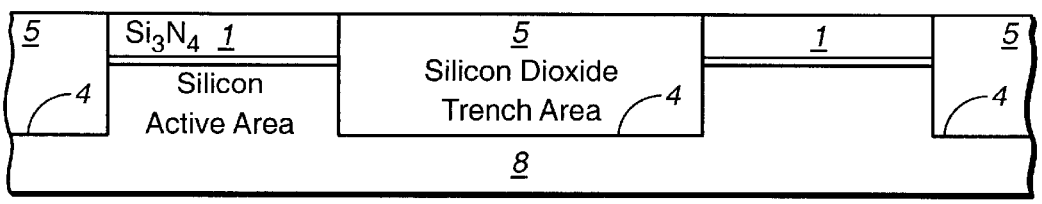
FIG._4

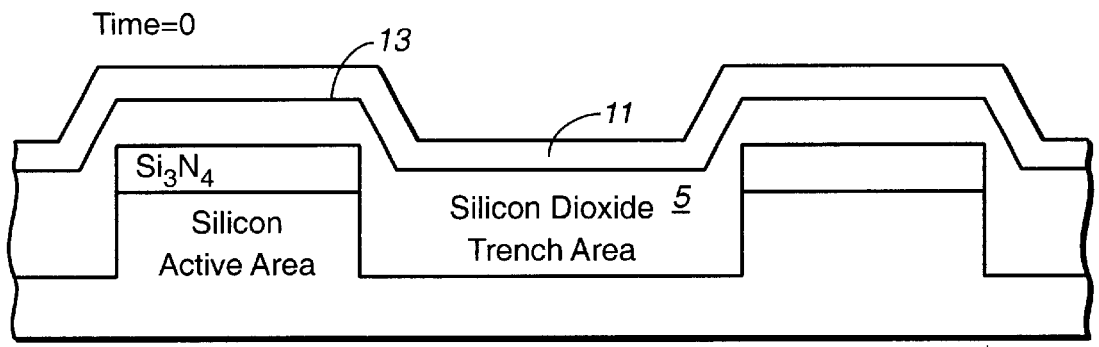
FIG._5
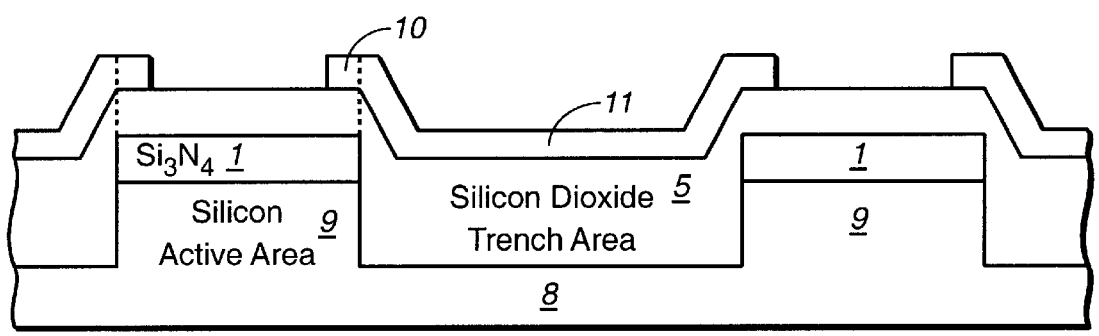
FIG._6
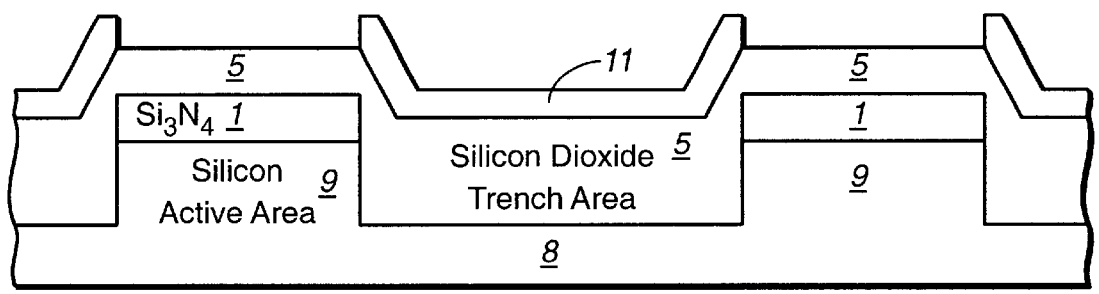
FIG._7
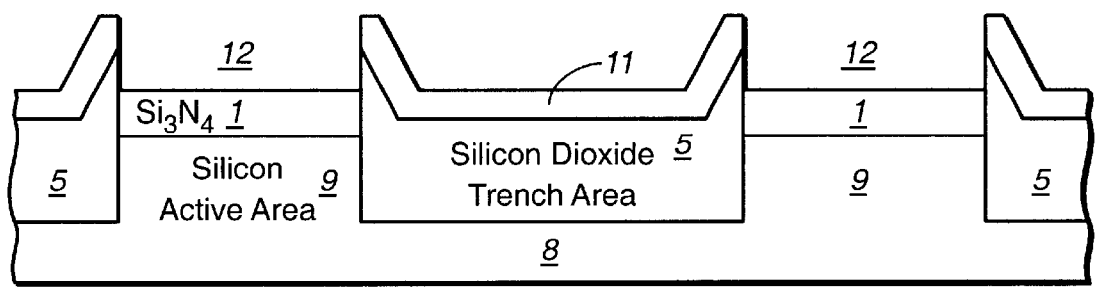
FIG._8

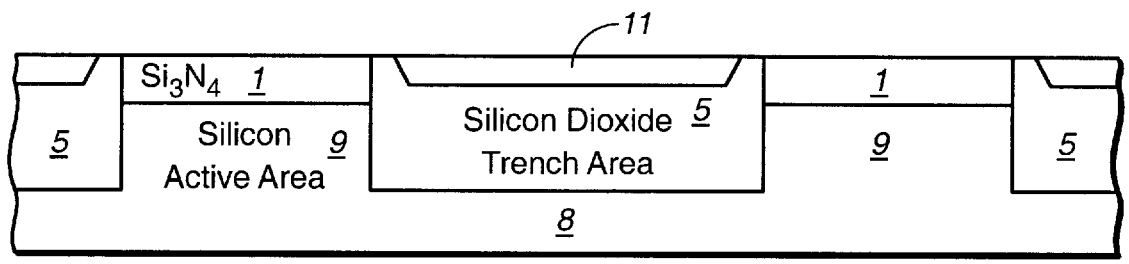
FIG._9
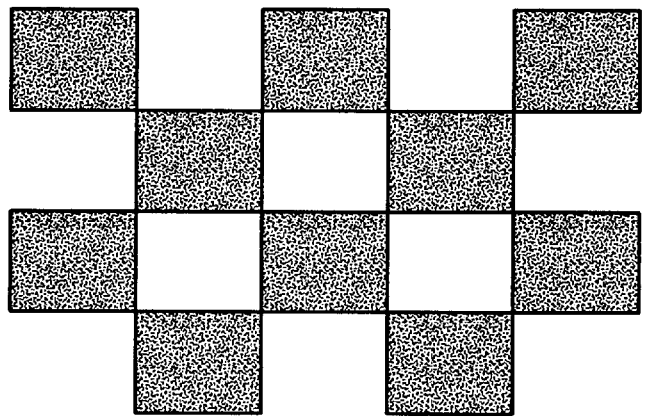
FIG._10

SUBSTRATE PLANARIZATION WITH A CHEMICAL MECHANICAL POLISHING STOP LAYER

BACKGROUND

The present invention generally relates to a method of fabrication of semiconductor devices. More specifically the present invention is directed towards the formation of planarized, dielectrically filled trenches and active areas on a semiconductor wafer substrate.

Increased miniaturization of integrated circuit devices requires a large number of surface conductors for the conveyance of digital signals from device to device. These devices differ in size and connectivity requirements. They include, but are not limited to transistors, diodes, capacitors and resistors. Some devices may have submicron feature sizes, while other devices on the same substrate may have much greater feature sizes. In addition to the miniaturization of active devices, active areas, contacts and electrically isolated areas, there also continues to be an increasing need for more interconnect layers which are themselves comprised of conductors having smaller dimensions. In order to accommodate the multiplicity of circuit devices an insulation means is required between them. Shallow trenches of varying widths are often used to isolate the various circuit devices.

Typically, shallow trenches are filled with a dielectric material such as silicon dioxide ($SiO_2$) to aid in insulation. Assuring an even topology and uniform fill of the silicon dioxide becomes increasingly difficult as shallow trenches of diverse sizes are used in conjunction with active areas of varying device densities.

The growing complexities of the topography of semiconductors, especially with the use of shallow trenches of varying width, create a problem with surface planarity. In order to promulgate this densification of devices, there has been increased reliance on planarized dielectrically filled trenches for proper insulation of active areas.

Many different techniques have attempted to create trenches having vertical walls that can be uniformly filled with dielectric material and maintain planarity with the active areas of a substrate. Some techniques use various "dummy structures" inserted into the field areas to provide improved planarity during chemical mechanical polishing (CMP).

A typical cross section of a prior art trench isolation structure is shown in FIG. 1. An active region silicon nitride layer 1 is deposited on the silicon surface 2 (including a pad oxide 3 under the silicon nitride). The silicon nitride layer will act as a protective layer over each active area 9 and act as a stop layer for the CMP process. A trench 4 is etched into a silicon substrate wafer 8 using photolithography to form isolation trenches and deposited with an oxide such as silicon dioxide 5 afterwards. The $SiO_2$ deposition forms to the topology on the silicon surface and reflects the topology of the coated surface.

An example of the topology of the oxide is shown in FIG. 1 at time=0. The chemical mechanical polishing process will first polish down the high features and erode the side walls, FIG. 1 at time t1. The process will continue in a similar manner at time t2. As the polishing process continues, the high features will continue to erode until an equilibrium planarity is obtained as illustrated in time t3. Once the equilibrium planarity is obtained, the planarity will not improve with additional polishing, as illustrated in time t4. At t3 and t4, the topology in the trench areas continues to include low features and does not show perfect planarity. When the polish process contacts the silicon nitride layer, the polish rate of the silicon nitride will be significantly lower than the oxide material. This selectivity causes more oxide to be removed in trench areas, and thus, recess the oxide even further. As the polish process continues, the degree of planarity is further aggravated. Therefore, improvement is needed in creating uniform planarity across the semiconductor surface.

SUMMARY OF THE INVENTION

Accordingly, this invention provides an improved method of planarizing a semiconductor substrate for use with an integrated circuit and the planarized semiconductor substrate. To improve planarity, chemical mechanical polishing is controlled through the use of a first stop layer 1 patterned with an active mask to define active areas formed over the top of a silicon substrate 8 and a pad oxide layer 3. A second stop layer 6 or 11 is formed over a dielectric filler layer 5, said filler layer 5 being formed over the first stop layer. A sequence relating to the application of a second stop layer and chemical mechanical polishing can be varied to accommodate specific circumstances.

In one embodiment equilibrium planarity is obtained from chemical mechanical polishing, FIG. 1, time=t3 of a dielectric oxide filler material 5 such as silicon dioxide. The filler material being applied after etching of the first stop layer. A second stop layer 6 comprising a material harder than the dielectric oxide filler material 5 is deposited on the polished surface of the filler material. For example the second stop layer may comprise polysilicon or silicon nitride. In this embodiment the second stop layer can be patterned in a uniform design across the entire surface, or patterned such that it will generally cover the shallow trench areas using a reverse mask of an active mask used in forming active areas.

The stop layer 6 can be applied in a pattern such as a "checkerboard" pattern (FIG. 10) whereby the density of the pattern is used to further control the rate of material removal during CMP. In the alternative the stop layer 6 can be generally formed on the filler layer over the valley regions of the trench areas 4 (FIG. 2) using a reverse active mask.

The reverse active mask stop layer slows the removal rate of silicon dioxide filler over the trench area during CMP and effectively increases material removal over the active area. As the silicon dioxide thickness is decreased in the active area during CMP, a valley 7 will form over the active area. During this same period of time, the CMP will slowly be removing the stop layer from over the trench areas. The stop layer will eventually be removed completely by CMP; however, a valley 7 over the active area should occur first. When the stop layer has been removed over the trench area 4, and a valley 7 has been formed over the active areas, FIG. 3, the removal rates over the active and trench areas will be equal until the polish reaches the first stop layer over the active areas. The removal rate of the continuing CMP will be slowed by the first stop layer masked over the active areas. This slowing allows the oxide in the trench areas to become planar with the first stop layer over the active areas, thereby improving the degree of planarity across the semiconductor device surface. (FIG. 4).

In another embodiment a second stop layer 11 is formed over a filler layer that has not been subjected to CMP. (FIG. 5.) The second stop layer is etched with a reverse tone pattern that opens the areas above the active areas 9. (FIG. 7.) CMP is then performed to planarize the surface. The opened areas are reduced more quickly than the areas covered by the second stop layer and planarization is thereby improved. The reverse tone etch can be used to etch through the second stop layer 11 into the filler layer 5, FIG. 7 or through the second stop layer 11 and the filler layer 5 to reach the first stop layer 1, FIG. 8. In addition a reverse tone mask can allow for overlap 10 of the active areas by the second stop layer.

BRIEF DESCRIPTION OF THE DRAWINGS

FIG. 1 illustrates various layers comprising an integrated circuit wafer and the effect chemical mechanical polishing has on the planarity.

FIG. 2 illustrates the placement of the stop layer over the trench areas.

FIG. 3 illustrates valley regions being formed over the active regions formed by chemical mechanical polishing.

FIG. 4 illustrates this invention showing a planarized surface over both active and trench areas.

FIG. 5 illustrates a stop layer deposited on a shallow filler layer.

FIG. 6 illustrates an embodiment wherein the stop layer provides for an overlap of the active region.

FIG. 7 illustrates a stop layer deposited on a filler layer and etched using a reverse tone mask of the active areas.

FIG. 8 illustrates reverse tone etch through the second stop layer and the filler layer.

FIG. 9 illustrates a substrate with a second stop layer with a reverse tone etch that has been planarized through CMP.

FIG. 10 illustrates a checkerboard pattern that can be utilized as a continuous pattern for the second stop layer.

DETAILED DESCRIPTION

The following detailed description of the preferred embodiments make reference to the accompanying drawings which form a part hereof and show by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the invention. The following detailed description is, therefore, not to be taken in a limiting sense and the scope of the present invention is defined by the appended claims. Accordingly, the following provides a detailed description of the invention comprising an improved method of planarizing a semiconductor substrate and the planarized substrate.

In forming integrated circuit wafers, a substrate wafer 8 is etched using a known method to create narrow trench areas and wide trench areas, the trenches 4 serving to separate active regions 9 each having respective active surfaces. The substrate wafer can include monocrystalline silicon, gallium arsenide or other semiconductor substrate material. For purposes of this embodiment, narrow trenches are defined as those which are less than or equal to four micrometers in width; all trenches wider than four micrometers are correspondingly defined as being wide.

This invention provides for preparing a silicon substrate for use with integrated circuitry by subjecting the substrate wafer to a relatively brief thermal oxidation operation to form a PAD oxide layer 3 comprising silicon dioxide or the like. The PAD oxide layer provides a stress relief interface between the silicon substrate and a subsequently deposited silicon nitride layer. Preferably, thermal oxidation to form the PAD is performed in a $H_2O$ and $O_2$ gas ambient environment at a temperature in the range of approximately 800° C. to 1150° C. and atmospheric pressure for a period of between 5 minutes to 5 hours. The shorter time period corresponds with the higher temperature. Likewise, the longer time period corresponds with the lower temperature. For example the thermal oxidation may take place in 5 minutes at 1150° C. or in 5 hours at 800° C. Thermal oxidation processes creates a substantially conformal thermal PAD oxide layer in the range of approximately 100 nanometers to 1 micron thick.

Following the growth of the PAD oxide, the substrate wafer is conformally covered with a first stop layer of silicon nitride or other material harder than the PAD oxide. Active and trench regions are defined with an active image mask used to pattern the first stop layer with etching. Preferably, this first stop layer comprises silicon nitride and is deposited using a plasma enhanced chemical vapor deposition operation with a mixture of $SiH_2Cl_2$ and $NH_3$, while in a chamber having an ambient temperature in the range of approximately 800° C. to 900° C., preferably around 850°, at a pressure in the range of approximately 0.05 torr up to 2.0 torr with approximately 0.25 torr being preferred. The deposition process will require a period ranging between approximately 10 minutes up to 4 hours depending on the temperature and pressure, to form a layer of silicon nitride approximately 100 nanometers to 1 micron thick with a preferred embodiment being approximately 1600 nanometers thick. The first silicon nitride layer will serve as the final layer to slow the CMP locally during final planarization.

Photolithography is used to define active regions 9 and trench regions 4 in the substrate. A first etching process etches into the silicon nitride and the oxide layer and the silicon substrate surface. Plasma etching can be accomplished using well-known standard lithography and plasma etching processes. Wet and dry etching may also be used if so desired. In those areas designated as trench areas the silicon substrate is etched to a depth of approximately 2000 angstroms to 10,000 angstroms with a preferred embodiment of approximately 3500 angstroms.

A liner oxide may be grown with a thermal process following the first etch. Silicon dioxide can be grown by exposing the silicon to a temperature of between 900° C. to 1100° C. The thickness of the silicon dioxide can be from 50 to 500 angstroms. The remainder of the trench can be filled with a conformal filler layer.

The filler layer can be applied using a High Density Plasma (HDP) deposition. HDP deposits are on top of structures and also in between structures but not necessarily on the sidewalls of structures. Therefore, in a trench area the sidewalls will have very little or no oxide deposited from the HDP process. The base region and the surface regions would, however, receive the deposition. A bevel like formation of approximately a 45° angle is typical for a sidewall structure 13 that separates the base from the surface region starting at an edge of a trench.

A typical filler layer of silicon dioxide layer will be approximately 600 nanometers thick. However, this invention can comprise layers 100 nanometers to 10,000 nanometers thick. In a preferred embodiment of this invention, the silicon dioxide comprising the filler layer 5 is subjected to an initial chemical mechanical polishing using a well-known CMP process until an equilibrium planarity is achieved such as is illustrated at time t3.

Having reached equilibrium planarity, a second stop layer 6 can be applied across the surface of the substrate and patterned with etching using a reverse image of the active mask. The reverse image mask layer is designed such that a second stop layer, comprising material harder than the silicon dioxide covers those areas complimenting the active image mask of first stop layer. Preferred materials for the second stop layer include silicon nitride and polysilicon, although other materials such as silicon carbide may be suitable so long as they exhibit greater resistance to CMP than the silicon dioxide. A second stop layer comprising silicon nitride can be applied utilizing a process such as the one described above for defining the active mask. Polysilicon may be applied using HDP or a high temperature furnace process.

After application and etching of the reverse active image into the second stop layer, the semiconductor is again processed using CMP. The affect of the stop layer is to slow the removal rate of the silicon dioxide filler layer in the trench areas and effectively increase the removal rate over the active area. As the oxide thickness is decreased in the active area using CMP, a valley 7 will form over the active area. (FIG. 3.) Continuing CMP will also cause the second stop layer to be slowly removed. Eventually the CMP will cause the stop layer to be removed completely. In a preferred embodiment a valley 7 will have formed over the active area 9 from the CMP before the stop layer 6 has been completely removed from the trench regions.

After the stop layer 6 has been removed in the trench regions, the removal rate of material during CMP will be equal over the active and trench areas until the polish reaches the first stop layer over the active area. The first stop layer now acts as a stop layer to slow the CMP over the active regions. At this point planarization will have been accomplished. (FIG. 4.) The slowed removal rate over the trench regions has allowed the silicon dioxide layer in the trench area to be planar with the silicon nitride layer over the active regions and improved the degree of planarity, as shown in FIG. 3.

A variation of this technique applies the second stop layer in a continuous pattern across the surface of the substrate instead of in a reverse active image pattern. The second stop layer can be applied in a pattern such as a checkerboard pattern. (FIG. 10.) The density of the pattern will directly affect the removal rate of the stop layer. High density patterns will be removed at a slower rate than lower density patterns. A high degree of control over planarization of different substrates can be accomplished through the use of such patterns. For example, with substrate including wide trench areas, the stop layer may be applied with a pattern density of 50% coverage. A stop layer with a 50% coverage pattern will be removed at a much faster rate than a solid pattern. Depending on the thickness of the stop layer and the size of the active versus trench regions, pattern coverage densities may range from 25% to 75%. A solid layer equaling a 100% dense coverage pattern. In this manner, control of the removal rate of the stop layer can be used to control planarization. Patterns can be designed into a stop layer with standard etching techniques.

Another embodiment of this invention provides for the application of a filler layer 13 of silicon dioxide to be shallow enough such that a stop layer can be deposited directly on top of the filler layer with no initial CMP of the filler layer to reach equilibrium planarity. (FIG. 5.) The stop layer can then be opened up over the active areas with etching using a reverse active mask. (FIG. 7.) In one embodiment, the etching continues and removes the filler layer over the active areas, forming a void area 12. (FIG. 8.) After etching, CMP brings the surface into planarity. (FIG. 9.)

Another technique for controlling planarization is to overlap the active regions when applying the reverse mask of the stop layer. Using this technique, a stop layer of silicon nitride is applied on top of the silicon dioxide filler layer. The stop layer silicon nitride is then etched in a pattern comprising a reverse mask of the active regions and thereby creating openings in the stop layer silicon nitride over the active areas. However, the reverse mask is designed such that if viewed from the top down, the stop layer silicon nitride would overlap 10 the active regions 9. (FIG. 6.) The opening in the stop layer silicon nitride will accelerate polishing in the opened areas. As a greater percentage of the active area is opened the polishing rate will increase. By allowing overlap of the active areas and thereby controlling the amount of the active area opened, greater control can be exerted over the polishing rate.

Stop layers comprising polysilicon or the like offer still greater control over planarization. Thermal cycling can convert polysilicon into silicon dioxide. Therefore, if a desired degree of planarization is reached during polishing, the stop layer of polysilicon, or the like, can be exposed to a thermal cycle and oxidized into silicon dioxide. Thereafter, any chemical mechanical polishing will planarize all areas equally as all areas will have materials of equal hardness.

Thermal cycling can also be used to consume residual stop layer material by controlling the degree of oxidation. For complete oxidation of a polysilicon stop layer into $SiO_2$, a typical thermal cycle would require cycling at a temperature of approximately 850° C. or higher. A higher temperature will increase the rate at which the polysilicon oxidizes into $SiO_2$.

Use of these techniques will vary according to the layout of the circuitry imposed upon the substrate that defines the active and trench regions. This invention is useful in manipulating the surface exposed to CMP thereby enabling someone skilled in this art to increase the polish rate in certain areas that are hard or high, while decreasing it in areas that are soft or low. The result is a planarized surface with the active areas exposed to receive an integrated circuit device. The trenches are uniformly filled with a dielectric material effectively isolating the devices.

The invention has been described in its presently contemplated best mode, and it is clear that is susceptible to various modifications, modes of operation and embodiments, all within the ability and skill of those skilled in the art and without the exercise of further inventive activity. Accordingly, it is intended to be protected by Letters Patent as set forth in the following claims.

What is claimed is:

1. A method for planarizing a surface of a semiconductor substrate, the method comprising:
   a) forming a PAD oxide layer on a silicon substrate wafer;
   b) depositing on said PAD oxide layer a first stop layer;
   c) defining active and trench regions in the substrate wafer by etching using an active mask image;
   d) applying a filler layer across the substrate wafer surface;
   e) applying a second stop layer on top of the filler layer;
   f) etching through the second stop layer with a reverse mask image of the active mask image, the reverse mask image causing the second stop layer to be located over the entire trench regions, but not be located over the active regions; and g) polishing the substrate surface with chemical mechanical until the first stop layer is encountered.

2. The method of claim 1 wherein the etching of the second stop layer stops when it encounters the filler layer.

3. The method of claim 1 wherein the etching of the second stop layer stops when it encounters the first stop layer.

4. The method of claim 1 wherein the PAD oxide layer comprises silicon dioxide.

5. The method of claim 1 wherein the PAD oxide layer is formed using thermal oxidation in a $H_2O$ and $O_2$ gas ambient environment at a temperature in the range of 800° C. to 1150° C. and atmospheric pressure, for a period of between 5 minutes to 5 hours; creating a substantially conformal thermal PAD oxide layer in the range of approximately 100 nanometers to 1 micron thick.

6. The method of claim 1 wherein the first stop layer comprises silicon nitride.

7. The method of claim 6 wherein the silicon nitride first stop layer is deposited using a plasma enhanced chemical vapor deposition operation with a mixture of $SiH_2Cl2$ and $NH_3$, while in a chamber having an ambient temperature in the range of approximately 800° C. to 900° C., at a pressure in the range of approximately 0.05 torr up to 2.0 torr, for a period ranging between approximately 10 minutes up to 4 hours, forming a layer of silicon nitride approximately 100 nanometers to 1 micron thick.

8. The method of claim 1 wherein the trench regions are defined to a depth of approximately 2,000 angstroms to 10,000 angstroms deep.

9. The method of claim 1 wherein the filler layer is silicon dioxide.

10. The method of claim 1 wherein the filler layer is approximately 100 nanometers to 10,000 nanometers thick.

11. The method of claim 1 wherein the second stop layer comprises silicon nitride.

12. The method of claim 1 wherein the second stop layer comprises polysilicon.

13. The method of claim 1 wherein the second stop layer comprises silicon carbide.

14. The method of claim 12 wherein the polysilicon is exposed to a thermal cycle and oxidized.

* * * * *